United States Patent [19]

Muro

[11] Patent Number: 4,841,138

[45] Date of Patent: Jun. 20, 1989

[54] PHOTOSENSITIVE POSITION SENSOR WITH LOGARITHMIC CONVERSION

[75] Inventor: Hideo Muro, Yokohama, Japan

[73] Assignee: Nissan Motor Co., Ltd., Yokohama, Japan

[21] Appl. No.: 90,603

[22] Filed: Aug. 28, 1987

[30] Foreign Application Priority Data

Aug. 28, 1986 [JP] Japan .................................. 61-200200
Aug. 28, 1986 [JP] Japan .................................. 61-200201

[51] Int. Cl.$^4$ ............................................. H01J 40/14
[52] U.S. Cl. .................................. 250/209; 250/214 L
[58] Field of Search ................ 250/206, 209, 201 AF, 250/214 L, 221 R, 208; 356/223; 354/425

[56] References Cited

U.S. PATENT DOCUMENTS

| | | | |
|---|---|---|---|
| 3,526,175 | 4/1967 | Reimann | 356/223 |
| 3,531,645 | 9/1970 | De Jong | 250/214 L |
| 3,670,637 | 6/1972 | Mori et al. | 356/223 |
| 3,736,057 | 5/1973 | Harvey | 250/201 AF |
| 4,445,029 | 4/1984 | Nagaoka et al. | 250/201 AF |
| 4,522,492 | 6/1985 | Masunaga | 250/201 AF |
| 4,548,504 | 10/1985 | Morander | 356/375 |
| 4,633,077 | 12/1986 | Ikara et al. | 250/221 |
| 4,698,494 | 10/1987 | Kato et al. | 250/211 R |

Primary Examiner—David C. Nelms
Attorney, Agent, or Firm—Foley & Lardner, Schwartz, Jeffery, Schwaab, Mack, Blumenthal & Evans

[57] ABSTRACT

A position sensor has a photosensitive element including a pn junction formed between first and second electrodes for providing first and second photocurrents varying in dependence on the position of an illuminated spot between the first and second electrodes, and a processing circuit including an current converting circuits for producing first and second detection currents corresponding to the first and second photocurrents, a first sum current equal to a sum of the first detection current and twice the second detection current and a second sum current equal to a sum of the second detection current and twice the first detection current, a logarithmic converting circuit for producing first, second, third and fourth voltages which are in logarithmic relationships with the first detection current, the first sum current, the second sum current and the second detection current, respectively, differential circuits for producing first and second differential output currents from a difference between the first and second voltages and third and fourth differential output currents from a difference between the third and fourth voltages, and an operating circuit for producing a position signal representing the position of the illuminated spot from the differential output currents.

17 Claims, 4 Drawing Sheets

PHOTOSENSITIVE POSITION SENSOR WITH LOGARITHMIC CONVERSION

CROSS REFERENCE TO RELATED APPLICATION

A U.S. application Ser. No. 925,219, filed Oct. 31, 1986, now abandoned, related to subject matter similar to that of the present application.

BACKGROUND OF THE INVENTION

The present invention relates to a light position sensor which has a photosensitive semiconductor element including a photosensitive surface composed of a reverse-biased pn junction formed between a pair of electrodes, and a processing circuit.

When a narrow beam of light is projected onto the photosensitive surface between the electrodes, the semiconductor element provides photocurrents which are taken, respectively, from the electrodes, and which vary in dependence on the position of illumination between the electrodes in such a manner that the total photocurrent is divided into the two photocurrents of the electrodes at a ratio determined by the position of illumination. The processing circuit processes the photocurrents from the electrodes to determine the position of illumination.

SUMMARY OF THE INVENTION

It is an object of the present invention to provide a photosensitive position sensor which is compact, reliable, uncostly and accurate.

According to the present invention, a photosensitive position sensor comprises a photosensitive semiconductor element, and a processing circuit which comprises a current coverting means, a logarithmic converting means, first and second differential pair circuits, and an operating means.

The photosensitive element comprises a first semiconductor layer of a first conductivity type which forms a photosensitive pn junction with a second semiconductor layer, such as an epitaxial layer, of a second conductivity type, and first and second electrodes connected to first and second separate positions of the first layer, respectively, for taking first and second photocurrents which vary in dependence on a position of a spot illuminated by a beam of light between the first and second electrodes.

The current converting means are connected with the photosensitive element, for receiving the first and second photocurrents, and producing a first detection current corresponding to the first photocurrent, a second detection current corresponding to the second photocurrent, a first sum current which is a sum of the first detection current and twice the second detection current, and a second sum current which is a sum of the second detection curent and twice the first detection current.

The logarithmic converting means, is connected with the current converting means for producing a first logarithmic voltage which is in a logarithmic relationship with the first detection current, a second logarithmic voltage which is in a logarithmic relationship with the first sum current, a third logarithmic voltage which is in a logarithmic relationship with the second sum current, and a fourth logarithmic voltage which is in a logarithmic relationship with the second detection current.

The first differential pair circuit is connected with the logarithmic converting means, for amplifying a difference between the first and second logarithmic voltages and producing first and second differential output currents, and the second differential pair circuit is connected with the logarithmic converting means, for amplifying a difference between the third and fourth logarithmic voltages and producing third and fourth differential output currents.

The operating means is connected with the first and second differential pair circuits for producing a position signal representing the position of the illuminated spot from the first, second, third and fourth differential output currents.

DETAILED DESCRIPTION OF THE INVENTION

Figure 4:
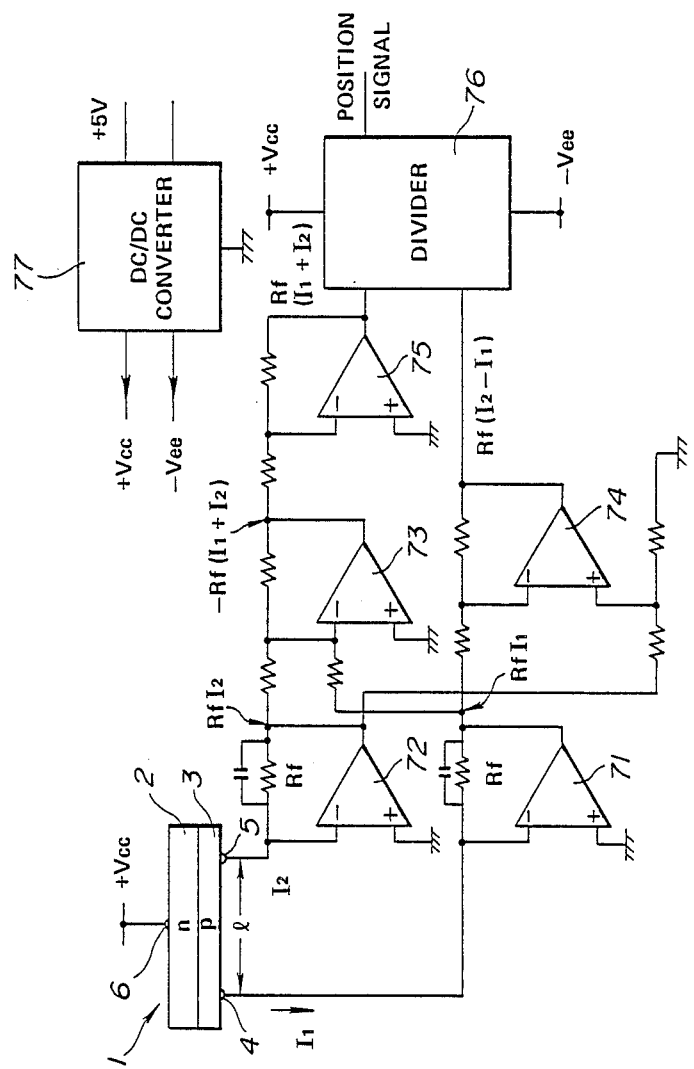
FIG. 4 is a circuit diagram showing a conventional position sensor.

To facilitate understanding the present invention, reference is made to a conventional position sensor shown in FIG. 4 ("Semiconductor position sensor and its application", Denshi Zairyo, February 1980, page 119 et seq.).

The conventional position sensor shown in FIG. 4 has a photosensitive semiconductor device 1 having a high resistivity n-type Si substrate 2, and a p-type layer 3 formed on the surface of the substrate 2. A photosensitive surface is formed by the pn junction between the n substrate 2 and the p layer 3. The photosensitive surface is rectangular when viewed in a plan view.

The semiconductor device 1 further has first and second electrodes 4 and 5 which are formed on the p layer 3. The first and second electrodes 4 and 5 are a distance 1 apart from each other, and extend substantially in parallel to each other. First and second photocurrents $I_1$ and $I_2$ are taken from the first and second electrodes 4 and 5, respectively.

The semiconductor device 1 further has a bottom third electrode 6. An $n^+$-type contact layer (not shown) is formed on the entire bottom surface of the Si substrate 2. The bottom electrode 6 formed on a part or the entirety of the $n^+$ contact layer A positive voltage $+Vcc$ is applied to the bottom electrode 6, and the pn junction of the photosensitive surface is reverse-biased by the positive voltage $+Vcc$.

The position sensor of FIG. 4 further has a signal processing circuit including two current/voltage converting circuits 71 and 72, an adder circuit 73, a subtracter circuit 74, an inverting circuit 75 and a general purpose divider 76. Each of the circuits 71–75 includes an operational amplifier as a main component. There is further provided a DC/DC converter 77 for supplying the voltage +Vcc for driving the divider 76 etc. and a voltage −Vee.

When an illuminated spot is formed by a beam of light at a position x (0<X<l) between the first and second electrodes 4 and 5 of the photosensitive semiconductor device 1, the first and second electrodes 4 and 5 provides the first and second photocurrent $I_1$ and $I_2$ expressed as follows:

$$I_1 = I_0 \cdot (l-x)/l \tag{1}$$

$$I_2 = I_0 \cdot x/l \tag{2}$$

In these equations I a total photocurrent produced by the illumination, and is equal to $(I_1+I_2)$. The first and second photocurrents $I_1$ and $I_2$ vary in accordance with the position x of the projected point while the total photocurrent remains constant.

The first and second photocurrents $I_1$ and $I_2$ are converted into voltages $Rf.I_1$ and $Rf.I_2$, respectively, by the current/voltage converting circuits 71 and 72. The adder circuit 73 adds both voltages $Rf.I_1$ and $Rf.I_2$, and the inverting circuit 75 delivers a sum voltage $Rf.(I_1+I_2)$ by inverting the output of the adder circuit 73. On the other hand, the substracter circuit 74 performs a subtraction between $Rf.I_1$ and $Rf.I_2$, and provides a difference voltage $Rf (I_2-I_1)$.

The divider 76 divides the difference voltage $Rf.(I_2-I_1)$ by the sum voltage $Rf.(I_1+I_2)$, and provides the following output.

$$(Vref/2) \cdot (I_2-I_1)/(I_1+I_2) = [(x/l)-\tfrac{1}{2}] \cdot Vref \tag{3}$$

In this equation, Vref is a constant reference voltage.

In this way, the position sensor delivers the output signal of the divider 76, as a position signal, which is indicative of the position x of projection and independent of the amount of illumination.

However, the conventional position sensor of FIG. 4 is disadvantageous in that it is unsuitable to size reduction, costly and low in reliability because of the necessity for many components such as the operational amplifier circuits 71–75, the divider 76 and the DC/DC converter 77.

Figure 1:
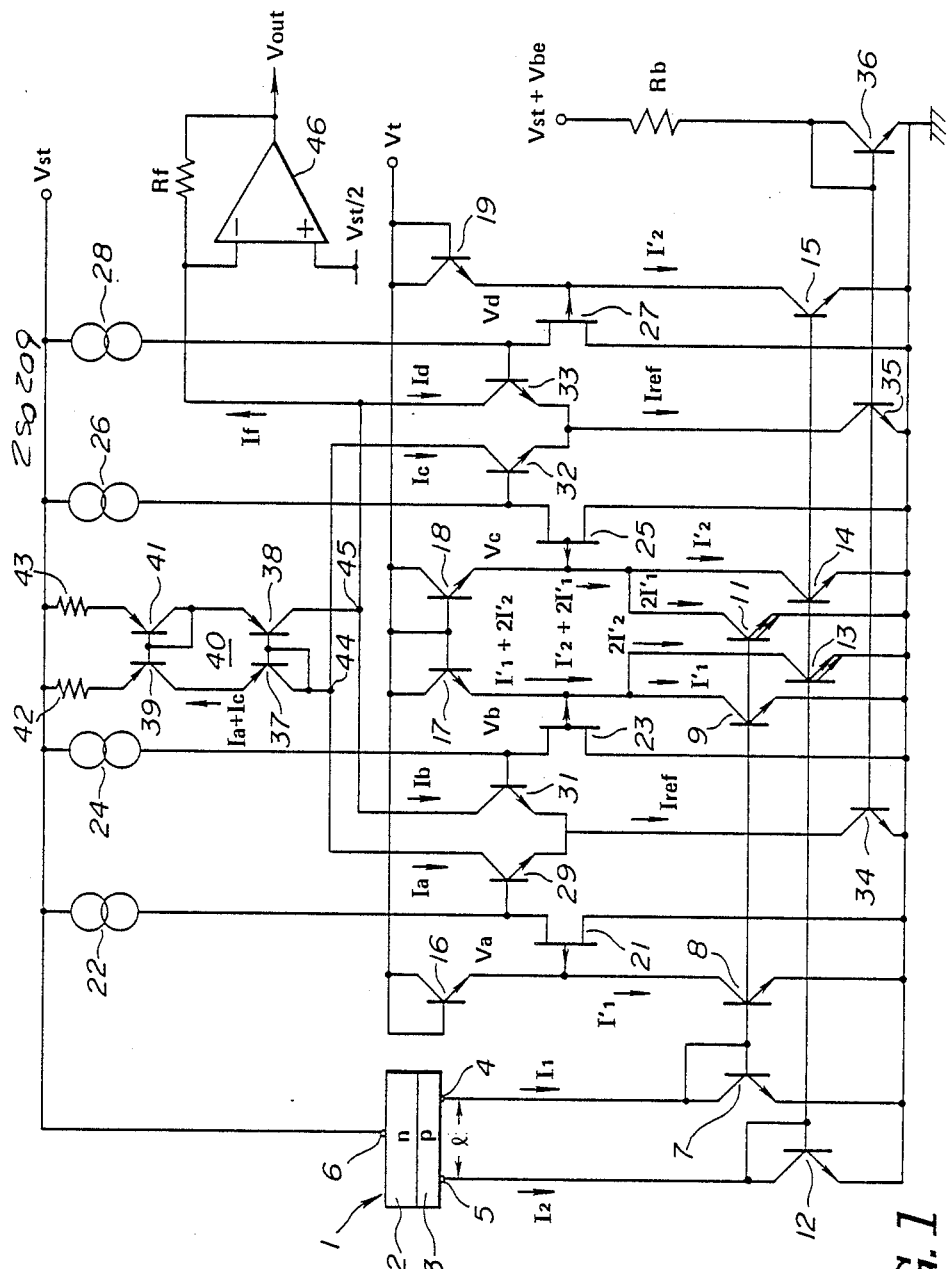
FIG. 1 is a circuit diagram showing a position sensor of a first embodiment of the present invention.
Figure 2:
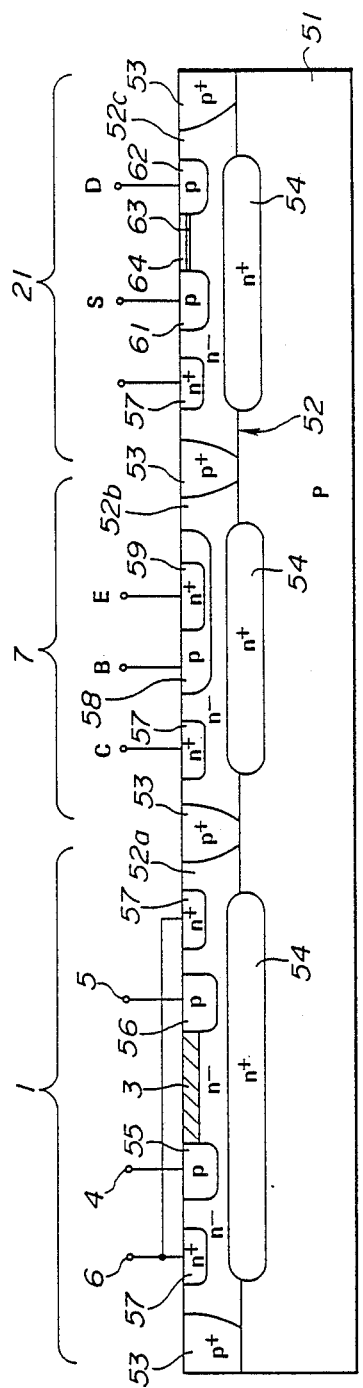
FIG. 2 is a vertical sectional view showing a portion of an IC chip including components of the position sensor of FIG. 1.

A first embodiment of the present invention is shown in FIGS. 1 and 2.

A position sensor of FIG. 1 has a photosensitive semiconductor element 1 for producing first and second photocurrents $I_1$ and $I_2$, and a signal processing circuit.

The semiconductor element 1 has a high resistivity n-type Si layer 2, a p-type layer 3 formed on the n-type layer 2 to form a pn junction serving as a photosensitive surface, first and second electrodes 4 and 5 separated at a distance l from each other, and a third electrode 6.

The signal processing circuit of FIG. 1 has a first current converting circuit (current mirror circuit) constituted by four npn transistors 7, 8, 9 and 11.

The base and collector of the transistor 7 are connected together, and the collector of the transistor 7 is connected with the electrode 4 of the semiconductor element 1. The transistor 7 serves as an input transistor, and the transistors 8, 9 and 11 serve as output transistors. The transistor 11 is a multiemitter transistor having two emitters.

In the collector of each of the output transistors 8 and 9, there is produced a first detection current $I_1'$ which is approximately equal to the first photocurrent $I_1$ supplied from the first electrode 4 of the element 1.

In the collector of the output transistor 11, there is produced a first double current $2I_1'$ whose magnitude is twice the magnitude of the first detection current $I_1'$.

The first detection current $I_1'$ is related to the first photocurrent I by the following equation:

$$I_1' = I_1 \cdot Hfe/(Hfe+5) \tag{4}$$

where Hfe is a grounded base current amplification factor of the npn transistors 7, 8, 9 and 11.

The second electrodes 5 of the photosensitive element 1 is connected to a second current converting circuit (current mirror circuit) which is formed by four npn transistors 12, 13, 14 and 15 substantially in the same manner as the first current converting circuit.

In the second current converting circuit, the transistor 12 serves as an input transistor, and the transistors 13, 14 and 15 serve as output transistors. The output transistor 13 is a multiemitter transistor.

In the collector of each of the output transistors 14 and 15, there is produced a second detection current $I_2'$ which is approximately equal to the second photocurrent $I_2$ In the collector of the output transistor 13, there is produced a second double current $2I_2'$ whose magnitude is twice the magnitude of the second detection current $I_2'$.

The second detection current $I_1'$ is related to the second photocurrent $I_2$ by the following equation:

$$I_2' = I_2 \cdot Hfe/(Hfe+5) \tag{5}$$

In the equation (5), Hfe is a current amplification facor of the npn transistors 12, 13, 14 and 15 in the grounded base configuration.

The collector of the transistor 9 of the first current converting circuit and the collector of the transistor 13 of the second current converting circuit are connected together, and a first sum current $(I_1'+2I_2')$ which is equal to the sum of the first detection current $I_1'$ and the second double current $2I_2'$ flows through a line common to the collectors of both transistors 9 and 13.

The collector of the transistor 11 of the first current converting circuit and the collector of the transistor 14 of the second current converting circuit are connected together, and a second sum curent $(I_2'+2I_1')$ which is equal to the sum of the second detection current $I_2'$ and the first double current $2I_1'$ flows through a line common to the collectors of both transistors 11 and 14.

The first and second current converting circuits serve as a current converting means.

Four npn transistors 16, 17, 18 and 19 constitute a logarithmic converting means. The transistors 16–19 are connected, respectively, with the collectors of the output transistors of the first and second current converting circuits. The transistor 16 is connected with the collector of the transistor 8. The transistor 17 is connected with the collectors of the transistors 9 and 13. The transistor 18 is connected with the collectors of the transistors 11 and 14. The transistor 19 is connected with the collector of the transistor 15.

In each of the transistors 16–19, the base and collector are connected together at a branch point, to which a positive voltage Vt is applied. Each of the transistors 16–19 performs a logarithmic conversion by utilizing a diode characteristic of the junction between the base and emitter. The transistors 16 and 19 perform the logarithmic conversions of the first and second detection currents $I_1'$ and $I_2'$, respectively. The transistors 17 and 18 perform the logarithmic conversions of the first sum current $(I_1'+2I_2')$ and the second sum current $(I_2'+2I_1')$, respectively. Each of the transistors 16–19 provides, at its emitter, a voltage Va, Vb, Vc or Vd which is in a logarithmic relationship with the input current.

The emitters of the transistors 16 and 17 are connected, respectively, to input terminals of a first differential pair circuit consisting of two npn transistors 29 and 31, through a first source follower consisting of a p-channel JFET 21 and a constant current source 22 and a second source follower consisting of a p-channel JFET 23 and a constant current source 24.

The first source follower 21, 22 and the second source follower 23, 24 are provided to prevent the base currents of the transistors 29 and 31 of the first differential pair circuit from causing errors by flowing through the transistors 16 and 17. Therefore, the currents of the constant current sources 22 and 24 are made large enough, as compared with the base currents of the transistors 29 and 31, so as to equalize voltages shifts between input and output. The same is true of third and fourth source followers mentioned later.

The first differential pair circuit 29, 31 amplifies the difference between the voltage Va obtained from the first detection current $I_1'$ and the voltage Vb obtained from the first sum current $(I_1'+2I_2')$, and provides a first differential output current Ia and a second differential output current Ib.

The emitters of the transistors 18 and 19 are connected, respectively, to input terminals of a second differential pair circuit consisting of two npn transistors 32 and 33, through a third source follower consisting of a p-channel JFET 25 and a constant current source 26 and a fourth source follower consisting of a p-channel JFET 27 and a constant current source 28.

The second differential pair circuit 32, 33 amplifies the difference between the voltage Vc obtained from the second sum current $(I_2'+2I_1')$ and the voltage Vd obtained from the second detection current $I_2'$, and provides a third differential output current Ic and a fourth differential output current Id.

Three npn transistors 34, 35 and 36 constitute a third current converting circuit (current mirror circuit) The base and collector of the transistor 36 are connected together, and the transistor 36 serves as an input transistor. The transistors 34 and 35 serve as output transistors. A positive voltage (Vst+Vbe) is applied to the collector of the input transistor 36 through a resistor Rb.

The collector of the output transistor 34 is connected to the branch point common to the emitters of the transistors 29 and 31 of the first differential pair circuit. The collector of the output transistor 35 is connected to the common emitter point common to the emitters of the transistors 32 and 33 of the second differential pair circuit.

A current expressed by the following equation flows through the collector of each of the output transistors 34 an 35.

$$\text{Iref} = \text{Vst} / \text{Rb} \tag{6}$$

The curent Iref is used as a constant curent in each of the first differential pair circuit 29, 31 and the second differential pair circuit 32, 33.

Four pnp transistors 37, 38, 39 and 41 and two resistors 42 and 43 constitute a high-precision fourth current converting circuit (current mirror circuit) 40. An input terminal 44 of the fourth current converting circuit 40 is connected with both the collector of the transistor 29 of the first differential pair circuit and the collector of the transistor 32 of the second differential pair circuit. An output terminal 45 of the fourth current converting circuit 40 is connected with both the collector of the transistor 31 of the first differential pair circuit and the collector of the transistor 33 of the second differential pair circuit. The output terminal 45 of the fourth current converting circuit 40 is connected with an inverting input terminal (−) of a curent/voltage converting circuit 46 which is composed of an operational amplifier.

A current (Ia+Ic) equal to the sum of the first differential output current Ia and the third differential output current Ic flows in the input side of the fourth current converting circuit 40, and a current of the same magnitude flows in the output side, too.

Accordingly, the fourth current converting circuit 40 delivers from the output terminal 45 to the current-/voltage converting circuit 46, a current equal to a difference resulting from subtraction of the current (Ib+Id) equal to the sum of the second and fourth differential output currents Ib and Id, from the current (Ia+Ic) equal to the sum of the first and third differential output currents Ia and Ic. The position of the illuminated spot is determined from this output signal.

Thus, the fourth current converting circuit 40 serves as an operational means for producing the current output indicative of the position of the illuminted spot from the four differential output currents Ia, Ib, Ic and Id.

A positive voltage Vst/2 is applied to a noninverting input terminal (+) of the circuit 46. The current/voltage converting circuit 46 converts the current indicative of the position of the illuminated spot into a voltage position signal Vout.

It is possible to form the photosensitive element 1, the current converting circuits, the logarithmic converting means and the differential pair circuits in a single semiconductor chip by using the bipolar IC technology. One example of such a monolithic bipolar IC is shown in FIG. 2. FIG. 2 shows only a portion including the photosensitive element 1, the npn transistor 7 and the p-channel JFET 21.

The semiconductor device of FIG. 2 has a p-type Si substrate 51 and an n⁻-type epitaxial layer 52 grown on the substrate 51.

The epitaxial layer 52 is divided into epitaxial islands 52a, 52b and 52c which are electrically isolated from on-e another by p+-type isolation diffusion walls 53 selectively formed in the epitaxial layer 52. Between the epitaxial layer 52 and the substrate 51, n+-type buried layers 54 are selectively formed for reduction of the collector resistance of the transistor or for other purposes.

The photosensitive element 1 is formed in the first epitaxial island 52a. In this example, the epitaxial layer 52 serves as the n̄ substrate region 2 shown in FIG. 1.

Two p-type regions 55 and 56 are formed in the epitaxial island 52a by diffusion. The p regions 55 and 56 are a predetermined distance apart from each other. A p-type layer 3 corresponding to the p layer 3 of FIG. 1 is formed in the epitaxial layer 52 between the p regions 55 and 56 by ion implantation of boron (B). The photosensitive surface is formed by the pn junction between the n⁻ epitaxial layer 52 and the p layer 3. There are further formed, in the first epitaxial island 52a, n+-type contact regions 57.

In the second epitaxial island 52a, there is formed the npn transistor 7 including a p-type base diffusion region 58 and an n+-type emitter diffusion region 59.

The p-channel JFET 21 is formed in the third epitaxial island 52c. A p-type pair of source and drain regions 61 and 62 are formed at a predetermined distance apart from each other in the island 52c. A p-type channel region 63 is formed in the epitaxial layer 52 between the source and drain region 61 and 62 by ion implantation of boron (B), and an n+-type gate region 64 is formed on the channel region 63.

The p-type regions 55, 56, 58, 61 and 62 are formed simultaneously by a single diffusion process with the p-type impurity. The n+-type regions 57 and 59 are formed simultaneously by a single diffusion process with the n-type impurity.

The other bipolar transistors and the other JFETs are also formed in the epitaxial layer 52, and electrically isolated, in the same manner as the npn transistor 7 and the p-channel JFET 21 shown in FIG. 2.

The position sensor of the first embodiment is operated as follows:

When a beam of light is projected onto the photosensitive surface of the sensing element 1 at a position x between the first and second electrodes 4 and 5, then the sensing element 1 delivers the first and second photocurrents $I_1$ and $I_2$ from the electrodes 4 and 5, respectively. The magnitudes of the first and second photocurrents vary in accordance with the position x of projection as expressed in the equations (1) and (2).

The first photocurrent $I_1$ flows into the input transistor 7 of the first current converting circuit, which produces the first detection current $I_1'$ expressed by the equation (4) at the collector of each of the output transistors 8 and 9, and the first double current $2I_1'$ at the collector of the output transistor 11.

The second photocurrent $I_2$ flows into the input transistor 12 of the second current converting circuit, which produces the second detection current $I_2'$ expressed by the equation (5) at the collector of each of the output transistors 14 and 15, and the second double current $2I_2'$ at the collector of the output transistor 13.

The first sum current $(I_1'+2I_2')$ is formed from the first detection current $I_1'$ produced by the output transistor 9 and the second double current $2I_2'$ produced by the transistor 13. The second sum current $(I_2'+2I_1')$ is formed from the second detection current $I_2'$ produced by the output transistor 14 and the first double current $2I_1'$ produced by the output transistor 11.

The first detection current $I_1'$, the first sum current $(I_1'+2I_2')$, the second sum current $(I_2'+2I_1')$ and the second detection current $I_2'$ flow, respectively, through the transistors 16, 17, 18 and 19 of the logarithmic converting means, and the voltages Va, Vb, Vc and Vd are obtained at the emitters of the transistors 16–19.

The voltages Va, Vb, Vc and Vd are expressed by the following equations (7).

$$Va = Vt - (kT/q).\ln(A_1 I_1'/Is)$$

$$Vb = Vt - (kT/q).\ln[A_1(I_1'+2I_2')/Is]$$

$$Vc = Vt - (kT/q).\ln[A_1(2I_1'+I_2')/Is]$$

$$Vd = Vt - (kT/q).\ln[A_1 I_2'/Is] \quad (7)$$

In the equations (7), k=Boltzmann constant, T=absolute temperature, q=electron charge, Is=reverse saturation curent of the base-emitter junction, and $A_1$=Hfe/(Hfe+1).

The voltage Va obtained by the logarithmic conversion of the first detection current $I_1'$, and the voltage Vb obtained by the logarithmic conversion of the first sum current $(I_1'+2I_2')$ are inputted into the first differential pair circuit 29, 31 through the source followers. The first differential pair circuit 29, 31 amplifies the difference between the voltages Va and Vb applied to its two input terminals, and produces the first and second differential output currents Ia and Ib.

The voltage Vc obtained by the logarithmic conversion of the second sum current $(I_2'+2I_1')$, and the voltage Vd obtained by the logarithmic conversion of the second detection current $I_2'$ are inputted into the second differential pair circuit 32, 33 through the source followers. The second differential pair circuit 32, 33 amplifies the difference between the voltages Vc and Vd applied to its two input terminals, and produces the third and fourth differential output curents Ic and Id.

The differential output currents Ia, Ib, Ic and Id are expressed by the following equations (8).

$$Ia = Iref/[1 + exp\ [(q/kT).(Vb-Va)]]$$

$$Ib = Iref/[1 + exp\ [(q/kT).(Va-Vb)]]$$

$$Ic = Iref/[1 + exp\ [(q/kT).(Vd-Vc)]]$$

$$Id = Iref/[1548 + exp\ [(q/kT).(Vc-Vd)]]$$

Substitution of the equations (7) for the voltages Va–Vd in the equations (8) and substitution of the equation (4) and (5) for the first and second detection currents $I_1$ and $I_2$ appearing in the equations (7) yield the following equations (9).

$$Ia = Iref.(I_1+2I_2)/2\ (I_1+I_2)$$

$$Ib = Iref.(I_1/2\ (I_1+I_2)$$

$$Ic = Iref.(I_2/2\ (I_1+I_2)$$

$$Id = Iref.(2I+I_2)/2\ (I_1+I_2)$$

From the currents Ia, Ib, Ic and Id given by the equations (9), the operating means constituted by the fourth current converting mirror circuit 40 produces the current position signal If given by the following equation (10).

$$\begin{aligned} If &= Ia + Ic - (Ib + Id) \\ &= Iref \cdot (I_2 - I_1)/(I_1 + I_2) \end{aligned} \quad (10)$$

The current/voltage converting circuit 46 receives the current signal if through its inverting input terminal, and delivers the output voltage Vout expressed by the following equation (11).

$$Vout = Vst/2 + Rf.Iref.(I_2-I_1)/(I_1+I_2) \quad (11)$$

Substitution of the equations (1) and (2) for the first and secod photocurrents $I_1$ and $I_2$ in the equation (11), and the equation (6) for the constant current Iref yields;

$$Vout = [\tfrac{1}{2} + (x/l - \tfrac{1}{2})2.Rf/Rb].Vst \quad (12)$$

In this embodiment, the resistances Rb and Rf are determined so that Rb=2Rf. Therefore;

$$V_{out} = V_{st} \cdot x / l \quad (13)$$

In this way, the position sensor of this embodiment provides the output voltage Vout, i.e. the position signal, representing the position.

In this embodiment, the photosensitive element 1, and the signal processing circuit can be formed in the single chip. Therefore, the device of this embodiment can improve the signal-to-noise ratio, enhance the accuracy of detection by enabling compensation for leakage current of the photosensitive element 1 within the same chip, and increase the reliability of the sensor.

Figure 3:
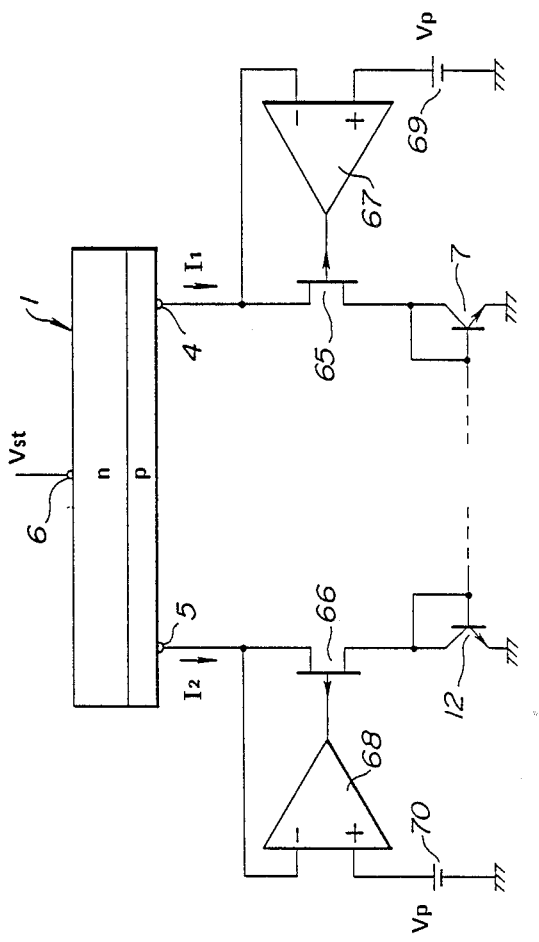
FIG. 3 is a circuit diagram showing a main portion of a position sensor of a second embodiment of the present invention.

A second embodiment of the present invention is shown in FIG. 3. In the second embodiment, each of the first and second electrodes 4 and 5 of the photosensitive element 1 is connected through a constant voltage buffer to the input transistor 7 or 12 of the first or second current converting circuit.

In addition to the components shown in FIG. 1, the device of FIG. 3 includes p-channel JFETs 65 and 66, operational amplifiers 67 and 68 and constant voltage sources 69 and 70 of a positive voltage Vp.

The electrode 4 of the sensing element 1 is connected to the source of the JFET 65, whose drain is connected to the input transistor 7 of the first current converting circuit. The inverting input terminal (−) of the operational amplifier 67 is connected to the source of the JFET 65. The output terminal of the operational amplifier 67 is connected to the gate of the JFET 65. The gate of the JFET 65 is driven by the operational amplifier 67, and the source potential of the JFET 65 is held at the constant voltage Vp.

The electrode 5 of the sensing element 1 is conected with the JFET 66 and the operational amplifier 68 in the same manner, as shown in FIG. 3.

In the device of the fist embodiment shown in FIG. 1, the emitter-base voltage of each of the input transistors 7, 12 varies with variation of the first or second photocurrent $I_1$ or $I_2$, so that the bias voltage of the sensing element 1 is varied. Therefore, when the illuminated spot approches each end of the photosensitive surface and the difference between the first and second photcurrents $I_1$ and $I_2$ is increased, the device of FIG. 1 tends to introduce errors in position detection.

In the position sensor of FIG. 3, the sensing element 1 is always biased by the constant voltage (Vst−Vp) irrespective of variations of the photocurrents $I_1$ and $I_2$, so that the measurement accuracy is improved.

Figure 5:
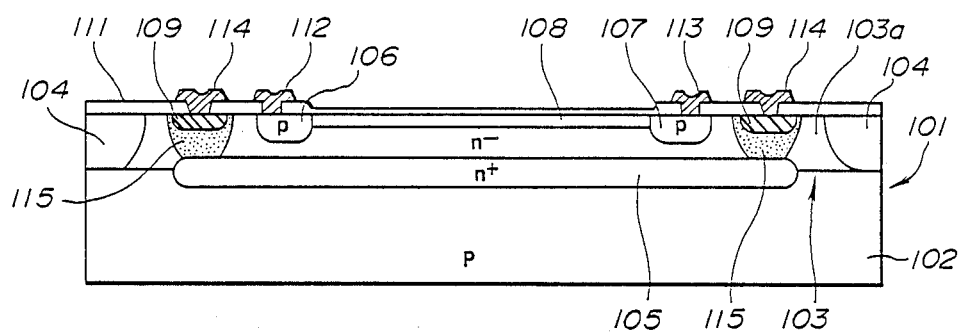
FIG. 5 is a vertical sectional view showing a photosensitive semiconductor element of a third embodiment of the present invention.
Figure 6:
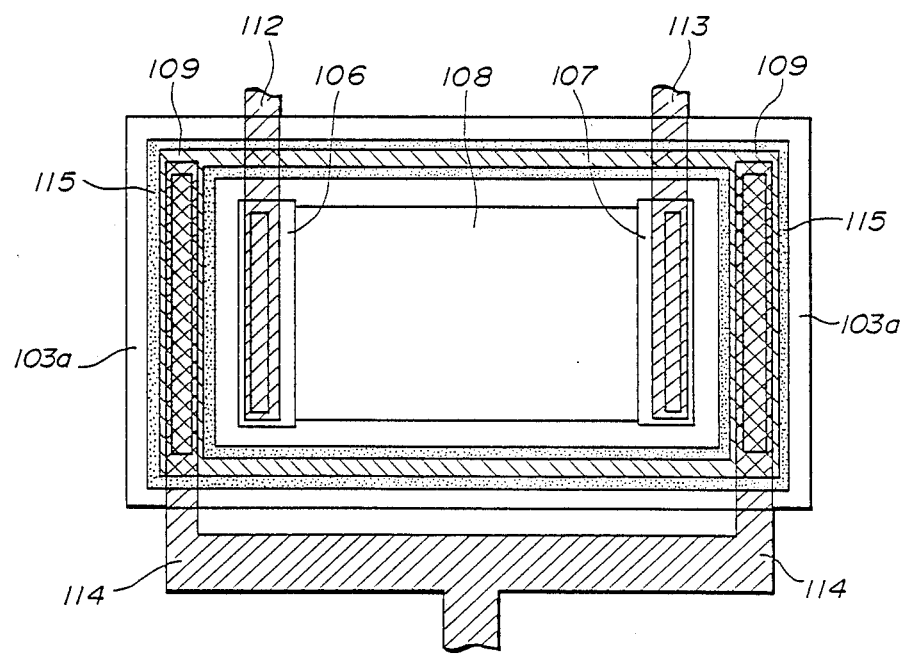
FIG. 6 is a plan view of the device of FIG. 5.

A third embodiment of the present invention is shown in FIGS. 5 and 6.

The structure of the photosensitive element 1 shown in FIG. 2 is known per se. In this structure, the photocurrent due to electron-hole pairs produced by illumination on the photosensitive surface flows from the electrode 6 through the n⁻ epitaxial layer 52 lying between the n+contact region 57 and the n+ buried layer 54, and then flows in the buried layer 54. Therefore, the resistance of the photocurrent path is unevenly distributed in the photosensitive surface. The voltage drop due to this unevenly distributed resistance influences the bias voltage applied to the photosensitive pn junction, and causes an uneven distribution of the bias voltage over the photosensitive surface. Therefore, especially when the illuminated spot approaches the end of the photosensitive surface, nonlinearity errors are introduced into the photocurrents $I_1$ and $I_2$, and the accuracy of the position detection is degraded.

The structure of the photosensitive element of the third embodiment shown in FIGS. 5 and 6 is designed to reduce the nonlinearity errors in the photocurrents and improve the accuracy of the position detection.

An epitaxial Si substrate 101 shown in FIG. 5 includes a p-type substrate 102 and a high resistivity n⁻-type epitaxial layer 103 formed on the substrate 102. An n⁻ epitaxial island 103a is isolated by p+ isolation diffusion walls 104 formed in the epitaxial layer 103. Between the epitaxial island 103a and the p substrate 102, there is formed an n+-type-buried layer 105 which is highly doped with an n⁻-type impurity such as antimony (Sb) or arsenic (As). The n+ buried layer 105 is provided to reduce the resistances of the paths of the photocurrents.

A pair of p-type regions 106 and 107 are formed in the epitaxial island 103a by diffusion. The p regions 106 and 107 are separated at a predetermined distance apart from each other, and extend substantially in parallel to each other. A high resistivity p-type layer 108 is formed in the epitaxial layer 103a between the p regions 106 and 107 by ion implantation with boron (B). As shown in FIG. 6, the p layer 108 is substantially rectangular, and extends from the p region 106 to the p region 107. A photosensitive surface is formed by the pn junction between the p layer 108 and the n⁻ epitaxial layer 103.

The device of FIGS. 5 and 6 further includes an n+ contact diffusion region 109 for the island 103a, and a silicon dioxide layer 111. In the area on the layer 108, the thickness of the oxide layer 111 is reduced to about 1000 angstrom.

The p regions 106 and 107 are connected, respectively, with Al anode electrodes 112 and 113 through contact holes formed in the oxide layer 111. The n+ contact region 109 is connected with a cathode electrode 114 through contact holes formed in the oxide layer 111.

The device of the third embodiment further includes a highly doped n+ region 115 formed in the epitaxial island 103a. The n+ region 115 extends around the rectangular photosensitive surface so as to draw a rectangle, as shown in FIG. 6. The n+ region 115 is deep and reaches the n+ buried layer 105 as shown in FIG. 5. The n+ region 115 is connected with the cathode electrode 114.

In this way, the resistance due to the epitaxial layer 103 is removed from the paths of the photocurrents.

Although FIGS. 5 and 6 show only the photosensitive element, components of a circuit for processing the photocurrents are integrated into the same substrate in the same manner as in the first embodiment.

The device of the third embodiment is operated as follows:

The photosensitive pn junction is revers-biased by a positive voltage applied to the cathode electrode 114. When a beam of light is projected onto the photosensitive surface, electron-hole pairs are generated at the illuminated spot, and a photocurent due to these electron-hole pairs flows from the cathode electrode 114 through the n+ region 115, and enters the n+ buried layer 105 from the side surface. The first and second photocurrents $I_1$ and $I_2$ are taken, respectively, from the anode electrodes 112 and 113. In the portion of the n+ buried layer 105, the photocurrent follows the shortest path from the side surface. Therefore, the structure of the third embodiment removes the resistance due to the high resistivity n⁻ epitaxial layer 103 from the photocurrent path within the semiconductor substrate 101, and prevents irregular resistance distribution over the photosensitive surface by causing the photocurrent to flow through the n+ buried layer 105 from the side surface along the shortest path. As a result, the structure of the third embodiment can make the bias voltage applied to the photosensitive pn junction unform over the entire photosensitive surface, and improve the measurement accuracy by reducing the nonlinearity errors in the output photocurrents.

What is claimed is:

1. A position sensor comprising;
   a photosensitive element comprising a first semiconductor layer of a first conductivity type which forms a photosensitive pn junction with a second semiconductor layer of a second conductivity type, and first and second electrodes connected to first and second separate positions of said first layer, respectively, for delivering first and second photocurrents which vary in dependence on a position of a spot illuminated by a beam of light between said first and second positions,
   current converting means for receiving said first and second photocurrents from said photosensitive element, and producing a first detection current corresponding to said first photocurrent, a second detection current corresponding to said second photocurrent, a first sum current which is a sum of said first detection current and twice said second detection current, and a second sum current which is a sum of said second detection current and twice said first detection current,
   logarithmic converting means for producing a first logarithmic voltage which is in a logarithmic relationship with said first detection current, a second logarithmic voltage which is in a logarithmic relationship with said first sum current, a third logarithmic voltage which is in a logarithmic relationship with said second sum current, and a fourth logarithmic voltage which is in a logarithmic relationship with said second detection current,
   a first differential pair circuit for amplifying a difference between said first and second logarithmic voltages, and producing first and second differential output currents,
   a second differential pair circuit for amplifying a difference between said third and fourth logarithmic voltages, and producing third and fourth differential output currents, and
   operating means for producing a position signal representing the position of the illuminated spot from said first, second, third and fourth differential output currents.

2. A position sensor according to claim 1 wherein said logarithmic converting means comprises first, second, third and fourth semiconductor devices each of which has a pn junction for performing a logarithmic conversion.

3. A position sensor according to claim 2 wherein said first, second, third and fourth logarithmic devices are arranged so that said first logarithmic voltage is substantially a linear function of a natural logarithm of said first detection current, said second logarithmic voltage is substantially a linear function of a natural logarithm of said first sum current, said third logarithmic voltage is substantially a linear function of a natural logarithm of said second sum current, and said fourth logarithmic voltage is substantially a linear function of a natural logarithm of said second detection current 4. A position sensor according to claim 3 wherein said operating means comprises means for producing a position current signal which is proportional to a difference resulting from subtraction of a sum of said second and fourth differential output currents from a sum of said first and third differential output currents.

5. A position sensor according to claim 4 wherein said current converting means comprises a first current converting circuit comprising an input npn transistor having collector and base which are both connected with said first electrode of said photosensitive element, and an emitter connected with a ground, first and second output npn transistors each of which has a base connected with the base of said input transistor, an emitter connected with the ground and a collector for providing said first detection current substantially proportional to said first photocurrent, a third output npn transistor having a base connected with the base of said input transistor, two emitters both connected with the ground and a collector for providing a current equal to twice said first detection current, and a second current converting circuit comprising an input npn transistor having collector and base which are both connected with said second electrode of said photosensitive element, and an emitter connected to the ground, a first output npn transistor having a base connected with the base of said input transistor of said second current converting circuit, two emitters both connected with the ground, and a collector for providing a current equal to twice said second detection current, and second and third output npn transistors each of which has a base connected with the base of said input transistor of said second current converting circuit, an emitter connected to the ground and a collector for providing said second detection current substnatially proportional to said second photocurrent.

6. A position sensor according to claim 5 wherein said first, second, third and fourth logarithmic devices of said logarithmic converting means are, respectively, first, second, third and fourth npn transistors each of which has base and collector which are connected together and to which a predetermined first positive voltage is applied, said first logarithmic device having an emitter, connected with the collector of said first output transistor of said first current converting circuit, for providing said first logarithmic voltage, said second logarithmic device having an emitter, connected with a branch point connecting the collector of said second output transistor of said first current converting circuit and the collector of said first output transistor of said second current converting circuit, for providing said second logarithmic voltage, said third logarithmic device having an emitter, connected with a branch point connecting the collector of said third output transistor of said first current converting circuit and the collector of said second output transistor of said second current converting circuit, for providing said third logarithmic voltage, and said fourth logarithmic device having an emitter connected with the collector of said third output transistor of said second current converting circuit, for providing said fourth logarithmic voltage.

7. A position sensor according to claim 6 wherein each of said first and second differential pair circuits comprises first and second npn transistors whose emitters are connected together.

8. A position sensor according to claim 7 wherein said operating means comprises a first pnp transistor having collector and base which ar both connected with an input branch point to which collectors of said first transistors of said first and second differential pair circuits are connected, a second pnp transistor having a base connected with the base of said first pnp transistor and a collector connected with an output branch point to which collectors of said second transistors of said first and second differential pair circuits are connected, a third pnp transistor having a collector connected with an emitter of said first pnp transistor, and a fourth pnp transistor having base and collector which are connected together and connected with a base of said third pnp transistor and with an emitter of said second pnp transistor, an emitter of each of said third and fourth pnp transistors being connected through a resistor to a branch point to which a predetermined second positive voltage is applied.

9. A position sensor according to claim 8 wherein the emitters of said first and second logarithmic devices are connected to said first differential pair circuit, respectively, through first and second source follower amplifiers each of which comprises a p-channel JFET, and the emitters of said third and fourth logarithmic devices are connected to said second differential pair circuit, respectively, through third and fourth source follower amplifiers each of which comprises a p-channel JFET.

10. A position sensor according to claim 9 wherein said operating means further comprises an operational amplifier having an inverting input terminal for receiving said position current signal, and an output terminal for providing a position voltage signal representing the position of the illuminated spot, and a feedback resistor connected between said inverting input terminal and said output terminal of said operational amplifier.

11. A position sensor according to claim 5 wherein said first electrode of said photosensitive element is connected to said first current converting circuit through a first buffer, and said second electrode is connected to said second current converting circuit through a second buffer.

12. A position sensor according to claim 11 wherein each of said first and second buffers comprises a p-channel JFET having a source connected with one of said first and second electrodes of said photosensitive element and a drain connected with said input transistor of one of said first and second current converting circuits, and an operational amplifier having an output terminal connected with a gate of said p-channel JFET, a noninverting input terminal to which a positive constant voltage is applied, and an inverting input terminal connected with the source of said p-channel JFET.

13. A position sensor according to claim 1 wherein said first semiconductor layer of said photosensitive element is formed in a surface of said second layer which is formed on a semiconductor substrate of said first conductivity type, and said photosensitive element further comprises a highly doped semiconductor buried layer of said second conductivity type formed between said substrate and said second layer, a highly doped second conductivity type semiconductor region formed in said second layer, and a third electrode connected with said highly doped second conductivity type region.

14. A position sensor according to claim 13 wherein said highly doped second conductivity type region surrounds said first layer.

15. A position sensor according to claim 14 wherein said highly doped second conductivity type region is deep and reaches said buried layer.

16. A position sensor according to claim 15 wherein said first layer is a p-type, and said second layer is an $n^-$-type epitaxial layer grown on said substrate of the p-type.

17. A position sensor according to claim 16 wherein said photosensitive element further comprises a pair of p-type semiconductor regions which extend in parallel to each other, and are connected, respectively, with said first second electrodes, said first layer being formed between said p-type regions.

* * * * *